United States Patent [19]

Kishita et al.

[11] Patent Number: 5,409,849
[45] Date of Patent: Apr. 25, 1995

[54] METHOD OF MANUFACTURING A COMPOUND SEMICONDUCTOR DEVICE HAVING GATE ELECTRODE SELF-ALIGNED TO SOURCE AND DRAIN ELECTRODES

[75] Inventors: Yoshihiro Kishita, Kawaguchi; Masanori Ochi, Urayasu; Souichi Imamura, Yokohama; Toshikazu Fukuda, Kawasaki, all of Japan

[73] Assignee: Kabushiki Kaisha Toshiba, Kawasaki, Japan

[21] Appl. No.: 58,684

[22] Filed: May 7, 1993

Related U.S. Application Data

[63] Continuation of Ser. No. 891,918, Jun. 1, 1992, abandoned, which is a continuation of Ser. No. 644,918, Jan. 23, 1991, abandoned.

[30] Foreign Application Priority Data

Jan. 24, 1990 [JP] Japan ................................. 2-14033
Dec. 19, 1990 [JP] Japan ................................ 2-403938

[51] Int. Cl.⁶ ............................................ H01L 21/265
[52] U.S. Cl. ........................................ 437/40; 437/203; 437/184; 257/280; 257/284; 156/644
[58] Field of Search ............... 357/22 R, 22, 22 I, 357/22 K; 437/184, 203, 40; 257/280, 284

[56] References Cited

U.S. PATENT DOCUMENTS

| | | | |
|---|---|---|---|
| 3,763,408 | 10/1973 | Kano et al. | 357/22 K |
| 4,545,109 | 10/1985 | Reichert | 357/22 I |
| 4,656,076 | 4/1987 | Vetanen et al. | 257/284 |
| 4,731,339 | 3/1988 | Ryan et al. | 357/22 I |
| 4,889,827 | 12/1989 | Willer | 257/284 |
| 4,981,809 | 1/1991 | Mitsuaki et al. | 437/184 |
| 5,021,857 | 6/1991 | Suehiro et al. | 357/22 |
| 5,264,379 | 11/1993 | Shikata | 437/184 |
| 5,300,445 | 4/1994 | Oku | 437/40 |
| 5,316,618 | 5/1994 | van Lintel | 156/651 |
| 5,358,885 | 10/1994 | Oku | 437/39 |

FOREIGN PATENT DOCUMENTS

| | | |
|---|---|---|
| 0113161 | 7/1984 | European Pat. Off. |
| 0308939 | 3/1989 | European Pat. Off. |
| 3706274 | 9/1987 | Germany .................. 357/22 |
| 62-156876 | 7/1987 | Japan .................. 357/22 |
| 63-204658 | 8/1988 | Japan .................. 357/22 |
| 1-4081 | 1/1989 | Japan .................. 357/22 |
| 1-194475 | 8/1989 | Japan .................. 357/22 |
| 2-16734 | 1/1990 | Japan .................. 437/184 |

OTHER PUBLICATIONS

Japanese Patent Abstract, vol. 10, No. 117 (E-400), May 2, 1986 and Japanese Published Patent Document No. 60-251671, Fujitsu K. K.

IBM Technical Disclosure Bulletin, vol. 28, No. 3, Aug. 1985, "Self-Aligned Recessed Gate MESFET", pp. 916-917.

Y. Takanashi et al., 8179 IEEE Electron Device Letters, vol. EDL-5, No. 7, Jul. 1984, "Control of Threshold Voltage of AlGaAs/GaAs 2DEG FET's through Heat Treatment", pp. 241-243.

Chang-Feng Wan et al., 8093 IEEE Transactions on Electron Devices, vol. 36, No. 5, May 1989, "Comparison of Self-Aligned and Non-Self-Aligned GaAs E/D MESFET's", pp. 839-845.

Primary Examiner—Brian E. Hearn
Assistant Examiner—Lynne A. Gurley
Attorney, Agent, or Firm—Finnegan, Henderson, Farabow, Garrett & Dunner

[57] ABSTRACT

According to this invention, there is provided a method of manufacturing a compound semiconductor which can be formed at a high yield and in which variations in characteristics of elements caused by variations in distances between a source and a gate and between a drain and the gate can be minimized. In addition, there is provided a compound semiconductor device having a structure capable of increasing a power gain and obtaining a high-speed operation. According to this invention, an active layer is formed on a compound semi-conductor substrate, and source/drain electrodes are formed on the active layer to be separated from each other. The wall insulating films are respectively formed on side walls of the electrodes, and a gate electrode is formed between the side wall insulating films to be respectively in contact therewith.

5 Claims, 7 Drawing Sheets

METHOD OF MANUFACTURING A COMPOUND SEMICONDUCTOR DEVICE HAVING GATE ELECTRODE SELF-ALIGNED TO SOURCE AND DRAIN ELECTRODES

This application is a continuation of application Ser. No. 07/891,918, filed Jun. 1, 1992, now abandoned, which is a continuation of Ser. No. 07/644,918, filed Jan. 23, 1991, now abandoned.

BACKGROUND OF THE INVENTION

1. Field of the Invention

The present invention relates to a compound semiconductor device and a method of manufacturing the same and, more particularly, to an improvement of a gate electrode arranged between source/drain electrodes and of a method of forming the gate electrode.

2. Description of the Related Art

A recess structure is conventionally known as a structure of an FET for obtaining a large power gain. According to this recess structure, a semiconductor region serving as a channel region is formed deeper than other semiconductor regions, and especially a source resistance of a surface depletion layer is reduced. Therefore, a transconductance gm can be increased, and a large power gain can be obtained.

Although the recess structure is generally and frequently used in a compound semiconductor device represented by a GaAs semiconductor device, some problems are posed in a manufacturing method of the recess structure.

According to a conventional manufacturing method, after an active layer is formed by a predetermined compound semiconductor, a source/drain electrode pattern is formed. A resist pattern of a gate electrode pattern is formed, and wet etching for obtaining a recessed groove (to be referred to as a groove) is performed using the resist pattern as a mask. A gate electrode is formed using a lift-off technique.

According to the conventional manufacturing method, the gate electrode can be formed to be self-aligned in the groove. However, the gate electrode cannot be formed to be self-aligned to the source/drain electrodes. For this reason, distances between the gate and source electrodes and between the gate and drain electrodes are different from each other. For example, when the distance between the gate and drain electrodes is decreased, a breakdown voltage is decreased. At the same time, the distance between the gate and source electrodes is increased. For this reason, a source resistance is increased, and a current transconductance gm is decreased.

As a result, the obtained compound semiconductor device such as a MESFET or an HEMT has characteristic variations. In the worst case, the compound semiconductor device is not shipped as a product, therefore, a yield of the production is decreased.

As described above, according to the conventional method, after source/drain electrodes are formed, a new resist pattern is formed, and a gate electrode is formed using the pattern as a mask. Therefore, since a gate electrode is formed by mask alignment, distances between the gate and source electrodes and between the gate and drain electrodes are different from each other, thereby causing characteristic variations in semiconductor devices, variations in the distance between, e.g., gate and drain electrodes appear as variations in breakdown voltage, and variations in distance between gate and source electrodes cause variations in source resistance and appear as variations in high-frequency characteristic.

SUMMARY OF THE INVENTION

The present invention has been made in consideration of the above problem, and has as its object to provide a method of manufacturing a compound semiconductor device which can be manufactured at a high yield and in which variations in characteristics of an element due to variations in distances between a source and a gate and between a drain and the gate can be minimized. In addition, there is provided a compound semiconductor device having a structure capable of increasing a power gain and obtaining a high-speed operation.

The above object can be achieved by the following arrangement.

According to the first aspect of the present invention, there is provided a semiconductor device characterized by comprising a compound semiconductor substrate having a major surface, an active layer formed in the major surface, source/drain electrodes formed on the active layer to be separated from each other, side wall insulating films respectively formed on side walls of the source/drain electrodes, and a gate electrode formed between the side wall insulating films to be respectively in contact with the side wall insulating films.

According to the second aspect of the present invention, there is provided a semiconductor device characterized by comprising a compound semiconductor substrate having a major surface, an active layer formed in the major surface, source/drain electrodes formed on the active layer to be separated from each other, insulating films respectively formed on the source/drain electrodes, side wall insulating films formed on side walls of the insulating films and on side walls of the source/drain electrodes, and a gate electrode formed between the side wall insulating films to be respectively in contact with the side wall insulating films.

According to the first and second aspects, a groove is formed in a part of the active layer between the side wall insulating films.

According to the third aspect of the present invention, there is provided a semiconductor device characterized by comprising a compound semiconductor substrate having a major surface, an active layer formed in the major surface, source/drain electrodes formed on the active layer to be separated from each other, a groove formed in a part of the active layer between the source/drain electrodes, side wall insulating films formed on side walls of the source/drain electrodes and on side walls of the groove, and a gate electrode formed between the side wall insulating films to be respectively in contact with the side wall insulating films.

According to the first aspect of the present invention, there is provided a method of manufacturing a semiconductor device, characterized by comprising the steps of forming an active layer in a semiconductor substrate, forming source/drain electrodes on the active layer, forming side wall insulating films on side walls of the source/drain electrodes, and forming a gate electrode between the side wall insulating films.

According to the second aspect of the present invention, there is provided a method of manufacturing a semiconductor device, characterized by comprising the steps of forming an active layer in a semiconductor substrate, forming source/drain electrodes on the active layer, forming side wall insulating films on side walls of the source/drain electrodes, forming a groove in a part of the active layer between the side wall insulating films using the side wall insulating films as masks, and forming a gate electrode between the side wall insulating films.

In a compound semiconductor device according to the first aspect, side wall insulating films are formed on side walls of the source/drain electrodes, and the gate electrode is formed between the side wall insulating films to be contact with the side wall insulating films. Therefore, the gate electrode is self-aligned to both the source/drain electrodes, and variations in distances between the source and the gate and between the drain and the gate can be minimized. In addition, since a position for the gate electrode can be set by the side wall insulating films, a total distance between the source and the drain and between the gate and the source can be decreased to be shorter than that obtained by using a photoetching method. For example, a source resistance can be reduced, and a power gain can be improved, thereby realizing a structure capable of obtaining a high-speed operation.

According to the above second aspect, the insulating films are respectively formed on the source/drain electrodes, and the side wall insulating films are formed from the side walls of these insulating films to the side walls of the source/drain electrodes. Therefore, the source/drain electrodes are covered with the insulating films. When the gate electrode is patterned, even when a mask error occurs, the source or drain electrode is not short-circuited with the gate electrode. As a result, a device in which a total distance between the source and the gate and between the gate and the source is shorter than that of the first aspect can be obtained.

According to the first and second aspects, a groove can be formed in the active layer between the side wall insulating films to obtain a recess structure.

According to the third aspect, even when the side wall insulating films are formed from the side walls of the source/drain electrodes to the side walls of the groove, the same effect as described in the first and second aspects can be obtained.

According to the first aspect of the manufacturing method of the compound semiconductor device of the present invention, side wall insulating films are formed on side walls of the source/drain electrodes, and the gate electrode is formed between the side wall insulating films. Therefore, the gate electrode can be formed to be self-aligned to both the source/drain electrodes. As a result, a position for forming the gate electrode can be determined without mask alignment using a photoetching method, and variations in distances between the source and the gate and between the drain and the gate can be minimized. In addition, a total distance between the source and the gate and between the gate and the drain can be decreased to be shorter than that obtained by the photoetching method.

According to the second aspect of the manufacturing method, a groove is formed between side wall insulating films using these films as masks. Therefore, a position for forming the groove can be determined without mask alignment using a photoetching method. When the groove is formed, since etching can be performed using an insulating film having a high adhesion strength with a member such as a substrate as a mask, pattern deformation caused by, e.g., removing a photoresist from the substrate does not occur. As a result, a probability for forming the groove can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

FIGS. 1A to 1J are sectional views showing an HEMT (High Electron Mobility Transistor) according to the first embodiment in the order of manufacturing steps. FIG. 2 is a sectional view showing a modification of the manufacturing steps.

Figure 1A:
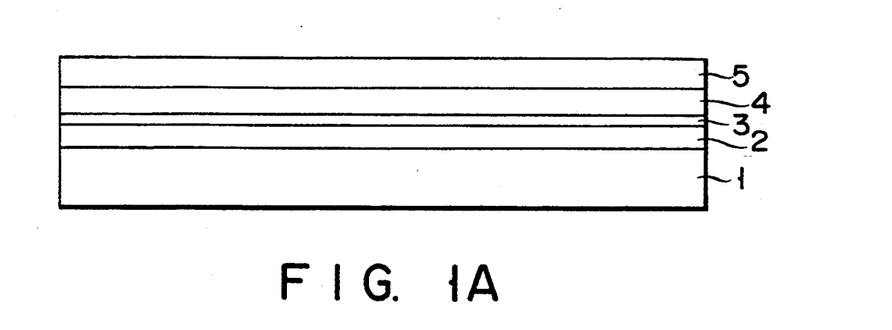
FIGS. 1A to 1J are sectional views showing an HEMT according to the first embodiment in the order of manufacturing steps.
Figure 2:
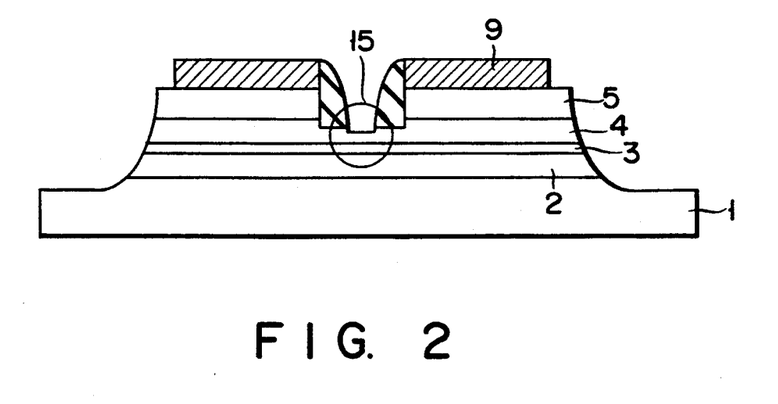
FIG. 2 is a sectional view showing a modification of the manufacturing method explained with reference to FIGS. 1A to 1J.

As shown in FIG. 1A, an undoped GaAs layer 2 is formed on a semi-insulating GaAs substrate 1 by, e.g., an MBE method or an MOCVD method, to have a thickness of about 500 [nm]. An undoped GaAlAs layer 3 is formed on the undoped GaAs layer 2 by, e.g., the MBE method or the MOCVD method, to have a thickness of about 5 [nm]. An n-type GaAlAs layer 4 is formed on the undoped GaAlAs layer 3 by, e.g., the MBE method or the MOCVD method, to have a thickness of about 80 [nm]. An n-type GaAs layer 5 is formed on the n-type GaAlAs layer 4 by, e.g., the MBE method or the MOCVD method, to have a thickness of about 100 [nm]. The n-type GaAs layer 5 is an ohmic region, and the n-type GaAlAs layer 4 is an electron supply layer. Since the undoped GaAlAs layer 3 is formed to obtain excellent characteristics of the HEMT, it is not necessarily formed. The undoped GaAs layer 2 is formed to obtain a heterojunction between the undoped GaAs layer 2 and the undoped GaAlAs layer 3 or between the undoped GaAs layer 2 and the n-type GaAlAs layer 4. In this case, a two-dimensional electron channel is formed near the interface of the heterojunction. Thus, the n-type GaAs layer 5, the n-type GaAlAs layer 4, and the undoped GaAs layer 2 constitute the active layer of the HEMT.

Figure 1B:
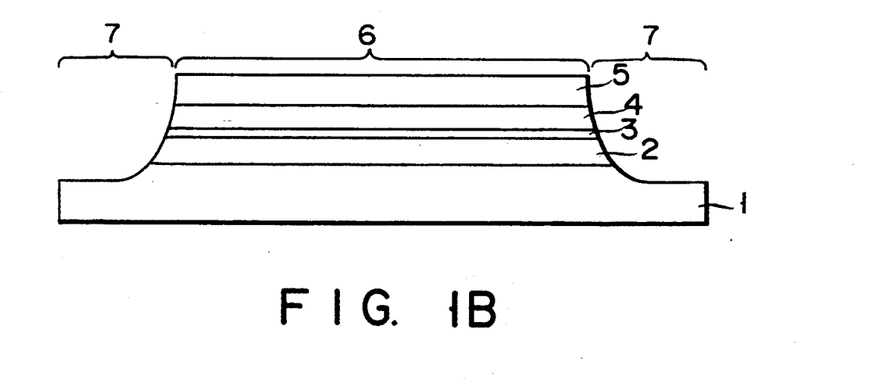

As shown in FIG. 1B, mesa etching is performed by a known method to isolate an element region 6. Reference numeral 7 in FIG. 1B denotes a portion where the mesa etching is performed.

Figure 1C:
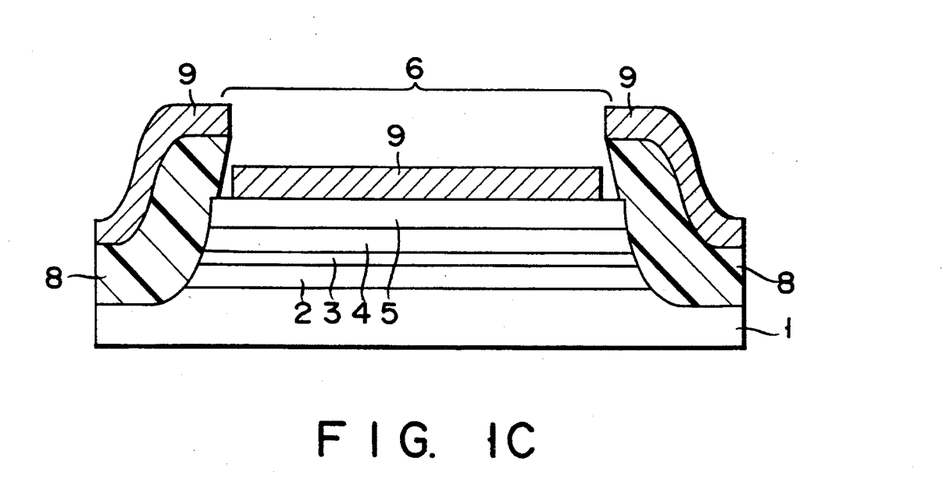

As shown in FIG. 1C, a photoresist 8 is coated on the entire surface of the resultant structure, and the photoresist is removed from the element region 6 using a photoetching method. A metal such as AuGe which can form ohmic contact with an n-type GaAs is formed on the entire surface of the resultant structure by, e.g., a sputter method to have a thickness of about 200 [nm]. A film made of, e.g., Au or Pt, is formed by, e.g., the sputter method to have a thickness of about 200 [nm], and an ohmic metal layer 9 consisting of a stacked film made of AuGe and Au or made of AuGe and Pt.

Figure 1D:
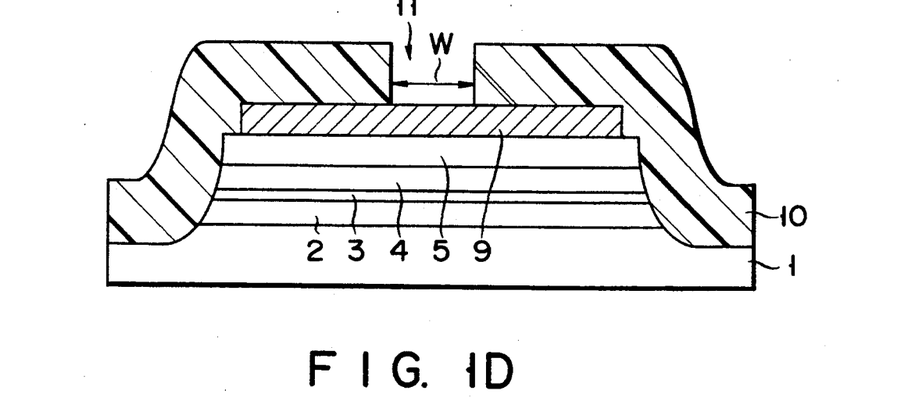

As shown in FIG. 1D, the ohmic contact layer 9 is removed together with the photoresist 8 (a selective removing process using a lift-off technique). A photoresist 10 is coated on the entire surface, and an opening 11 is formed in the photoresist 10 using a photoetching method. For example, the size of the opening 11 has a width $W = 2.5$ [$\mu$m].

Figure 1E:
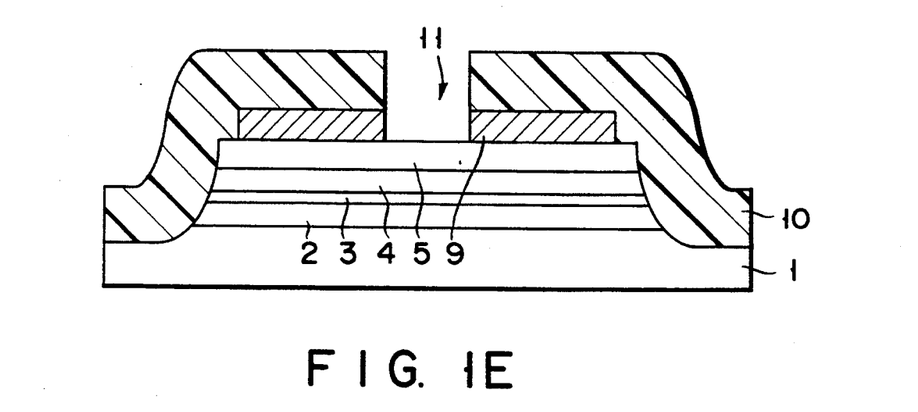

As shown in FIG. 1E, the ohmic metal layer 9 is selectively removed using the photoresist 10 as a mask by using, e.g., ion milling.

Figure 1F:
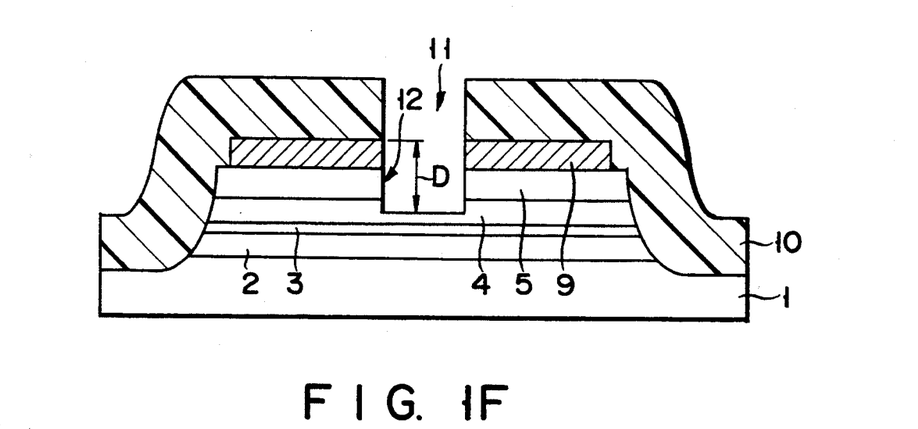

As shown in FIG. 1F, the n-type GaAs layer 5 is selectively removed using the photoresist 10 as a mask by an RIE method serving as anisotropic etching. Subsequently, the n-type GaAlAs layer 4 is partially removed to have a thickness of about 50 [nm] from the n-type GaAlAs layer 4 having the thickness of about 80 [nm]. Thus, a groove 12 for constituting a recess structure is formed. A depth D from the ohmic metal layer 9 of the groove 12 is about 350 [nm].

The step shown in FIG. 1F may be performed by not only an RIE method but also by ion milling which is used in the step shown in FIG. 1E. In consideration of damage to the n-type GaAs layer 5 and the n-type GaAlAs layer 4, the RIE method which causes loss damage to these layers than ion milling is desirable. Although the RIE method is used, the n-type GaAs layer 5 and the n-type GaAlAs layer 4 are slightly damaged. Therefore, in order to remove the damaged semiconductor surface, after the RIE process described in FIG. 1F, wet etching may be performed using a solution mixture of $PH_3 + H_2O_2 + H_2O$ to lightly remove the exposed surfaces (damaged surface) of the n-type GaAs layer 5 and the n-type GaAlAs layer 4. As another method of removing the damaged surface, after the RIE process, the photoresist 10 is removed, and annealing is performed at a temperature of, e.g., 300° C., for 10 minutes, thereby correcting the damaged surface.

Figure 1G:
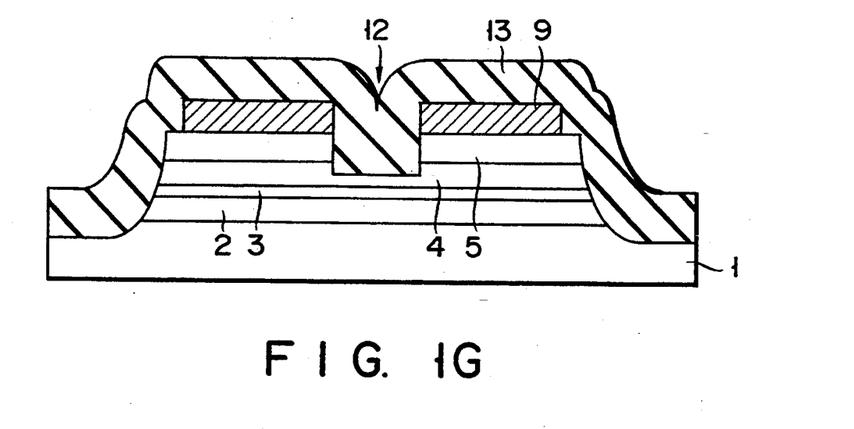

As shown in FIG. 1G, a plasma CVD oxide film 13 is formed on the entire surface of the resultant structure by, e.g., a plasma CVD method.

Figure 1H:
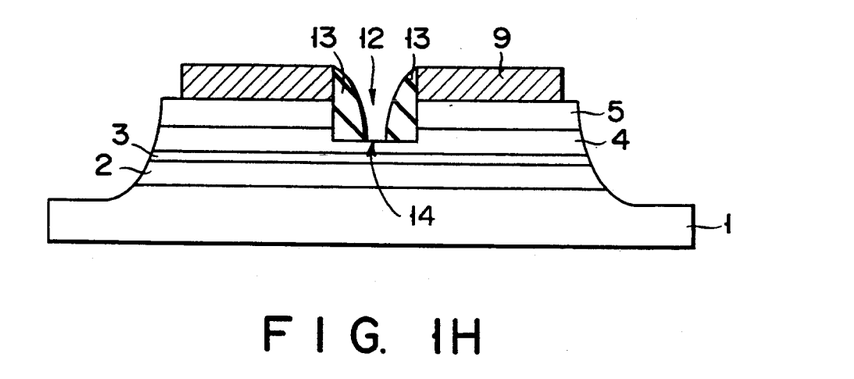

As shown in FIG. 1H, the plasma CVD oxide film 13 is etched back by, e.g., an RIE method. Thus, the side wall insulating film 13 (to be referred to as a side wall 13 as needed, hereinafter) consists of the plasma CVD oxide film along the side wall of the groove 12. Note that n-type GaAlAs layer 4 is exposed at the bottom portion of the groove 12, and the exposed surface is represented by reference numeral 14.

After the step shown in FIG. 1H, in order to remove the damaged surface, the exposed surface 14 (damaged surface) of the n-type GaAlAs layer 4 at the bottom portion of the groove 12 may be lightly wet-etched using the plasma CVD oxide film 13 as a mask, as shown in FIG. 2. In FIG. 2, the portion where the exposed portion is lightly removed is shown in a circle 15. In addition, in order to eliminate the damage, the above annealing may be performed to correct the damage.

Figure 1I:
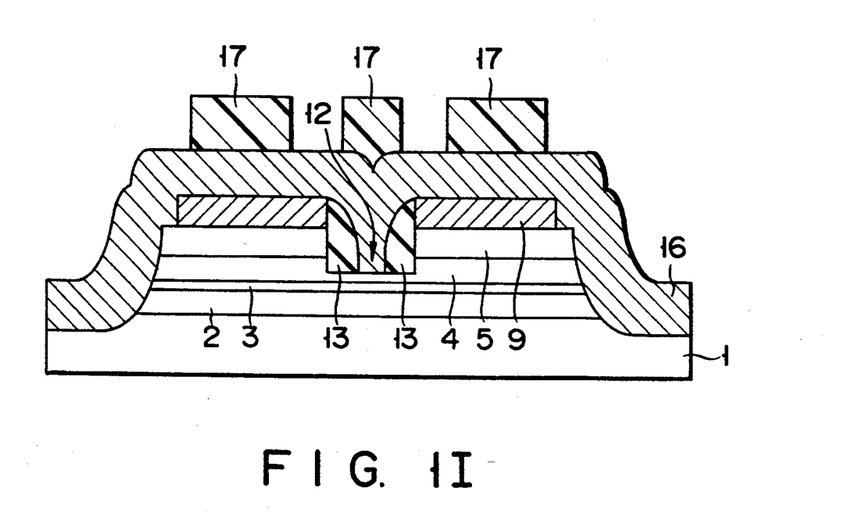

As shown in FIG. 1I, a metal film made of, e.g., Ti, which can form a Schottky contact with an n-type GaAlAs is formed on the entire surface by, e.g., a sputter method. Subsequently, an Al film is formed by, e.g., a sputter method, to form a Schottky metal layer 16 consisting of a stacked film made of Ti and Al. The Schottky metal layer 16 may be formed by stacked films consisting of three films respectively made of Ti, Pt, and Al. A photoresist 17 is coated on the entire surface, and a pattern for forming a gate electrode, a source electrode, and a drain electrode is formed on the photoresist 16.

Figure 1J:
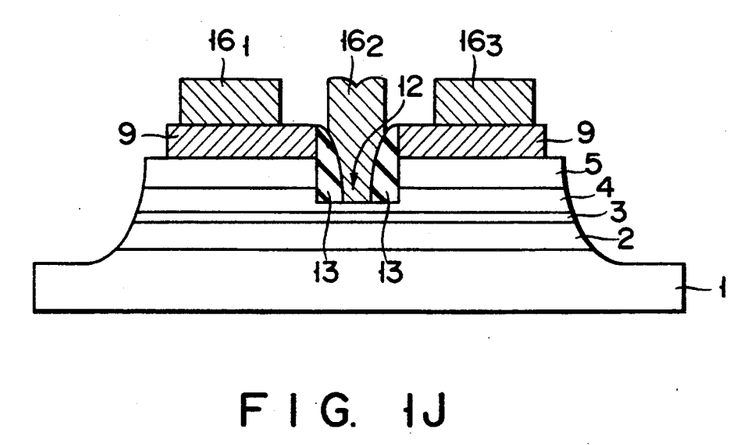

As shown in FIG. 1J, the Schottky metal layer 16 is removed using the photoresist 17 as a mask by, e.g., ion milling. Thus, a source electrode $16_1$, a gate electrode $16_2$, and a drain electrode $16_3$ are formed. The source electrode $16_1$ and the drain electrode $16_3$ are electrically integrated with the ohmic metal layer 9 under these electrodes.

According to the above method, an HEMT according to the first embodiment is formed.

According to the above manufacturing method, the gate electrode $16_2$ can be formed to be self-aligned to the source electrode $16_1$, which is electrically integrated with the ohmic metal layer 9, and the drain electrode $16_3$, which is electrically integrated with the ohmic metal layer 9. As a result, distances between the gate and drain electrodes $16_2$ and $16_3$ and between the gate and source electrodes $16_2$ and $16_1$ are constant, and variations in characteristics are decreased in each of the formed HEMTs. In addition, a yield of production can be increased.

Figure 3:
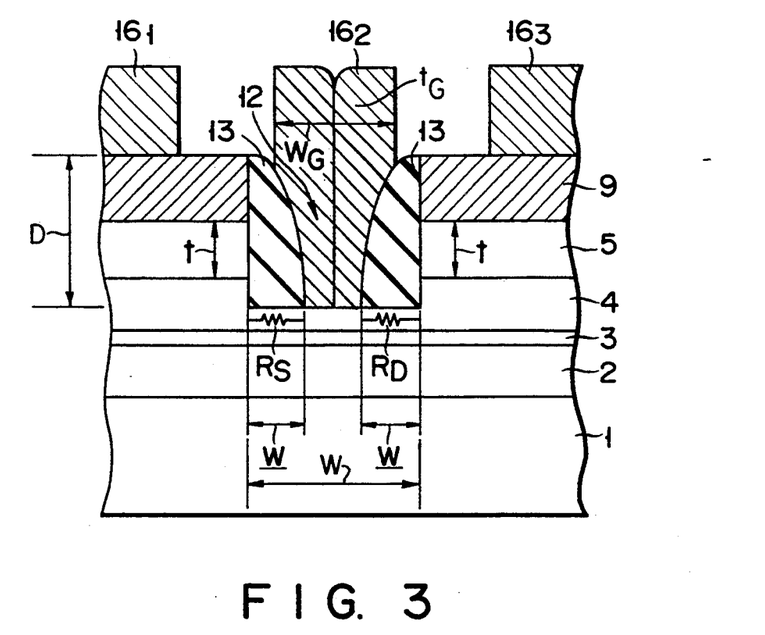
FIG. 3 is an enlarged view showing a portion near a groove 12 of the HEMT shown in FIG. 1J.

FIG. 3 is an enlarged view showing a portion near the groove 12 of the HEMT shown in FIG. 1J. The same reference numerals in FIG. 3 denote the same parts as in FIG. 1J.

As shown in FIG. 3, the groove 12 for obtaining a recess structure is formed to have a side surface almost perpendicular to the GaAs substrate 1. A side wall consisting of the plasma CVD oxide film 13 is formed along the side surface. The gate electrode $16_2$ is formed to be in contact with the exposing surface of the side wall 13. In a conventional HEMT, the above groove is formed by wet etching (isotropic etching), and the side surfaces of the groove are tapered. This tapered portion prevents micropatterning in the horizontal direction. In addition, the method of forming the gate electrode prevents the micropatterning in the horizontal direction by using a photoetching method such as a lift-off technique.

In the HEMT shown in FIG. 3, since the groove 12 is formed almost perpendicularly to the GaAs substrate 1, the micropatterning in the horizontal direction can be easily obtained. As described above, since the gate electrode is formed to be self-aligned to the source/drain electrodes, the micropatterning in the horizontal direction can be further easily obtained.

In addition, since the taper included in the conventional HEMT is formed in a semiconductor layer constituting the source/drain regions, a transitional change in the source/drain regions is caused. At the taper bottom, the thickness of the above semiconductor layer is necessarily decreased, and a parasitic high-resistance region appears. In the HEMT shown in FIG. 3, since no taper is formed, a transitional change in resistance of the n-type GaAs layer 5 or the n-type GaAlAs layer 4 constituting the source/drain regions is small, and a parasitic high-resistance region is not formed. As described above, according to the HEMT of the first embodiment of the present invention, micropatterning can be easily obtained, and a high power gain and a high-speed operation can be obtained.

Since the groove 12 is formed by anisotropic dry etching represented by an RIE method or ion milling, a groove having a depth larger than that obtained by wet etching can be formed. This is because a pattern of a photoresist is hard to be deformed due to the dry etching. Therefore, a thickness t of the GaAs layer 5 can be increased, and the resistance of the GaAs layer 5 can be reduced. For example, although the maximum thickness t=50 [nm] is obtained by conventional wet etching, the thickness t=100 [nm] or more can be obtained in the above manufacturing method.

As described above, in an HEMT according to the first embodiment of the present invention, especially a contact resistance of the source/drain regions can be further decreased, and a large transconductance gm can be obtained. As a result, according to the present invention, a high-performance HEMT capable of obtaining a large power gain, a small noise index, and a high S/N ratio can be obtained.

A major source resistance Rs and a major drain resistance Rd in the n-type GaAlAs layer 4 can be exactly controlled by variously changing the width w of the side wall 13. It is proved that the controllability for the width w is highly accurate at a present manufacturing level, and a change in resistance is small due to a change in the width w. Therefore, the transconductance gm can be appropriate to a breakdown voltage or the like with high accuracy. For example, when the groove 12 has a width W=about 2.5 [μm] and a depth D=about 350 [μm], the thickness of the side wall 13 is controlled to be about 1.0 [μm]. Since the gate electrode $16_2$ is in contact with the exposing surface of the side wall 13 and formed to fall in the groove 12, a positioning error of the gate electrode does not occur. Since the groove 12 is formed such that its bottom is narrow by the side wall 13, a thickness $T_G$ of the gate electrode $16_2$ can be formed to be large. When a width $W_G$ of the gate electrode $16_2$ is sufficiently large by a lithographic process, the thickness $T_G$ and the width $W_G$ can be increased, thereby decreasing the gate resistance. From this point, a high-speed operating HEMT especially having an excellent high-frequency response can be obtained. This gate electrode $16_2$, the source electrode $16_1$, and the drain electrode $16_3$ are formed by etching the Schottky metal layer 16 using ion milling in the above manufacturing method. However, a lift-off technique may be used in place of the ion milling.

The second embodiment of the present invention will be described below with reference to FIGS. 4A to 4F. FIGS. 4A to 4F are sectional views showing a MESFET according to the present invention in the order of manufacturing steps.

Figure 4A:
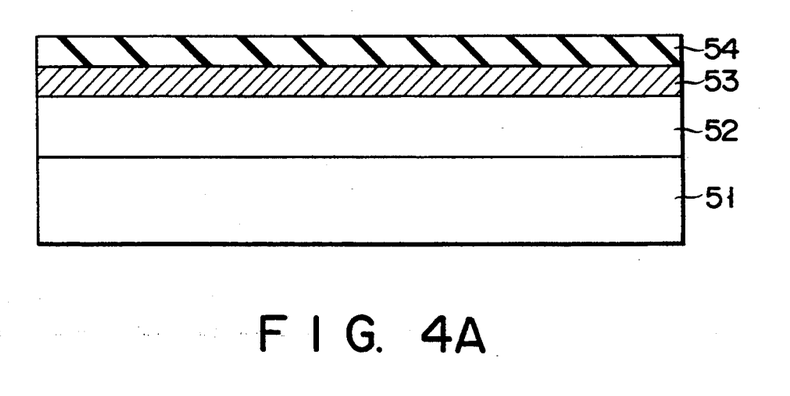
FIGS. 4A to 4F are sectional views showing a MESFET according to the second embodiment in the order of manufacturing steps.

As shown in FIG. 4A, a buffer layer (not shown, which is not necessarily formed) and an active layer 52 are formed on a semi-insulating GaAs substrate 51. An ohmic metal layer 53 which is a three-layered film consisting of, e.g., an AuGe film having a thickness of 200 [nm], an Ni film having a thickness of 30 [nm], and an Au film having a thickness of 800 [nm] is formed on the active layer 52. A plasma SiON film 54 is formed on the ohmic metal layer 53.

Figure 4B:
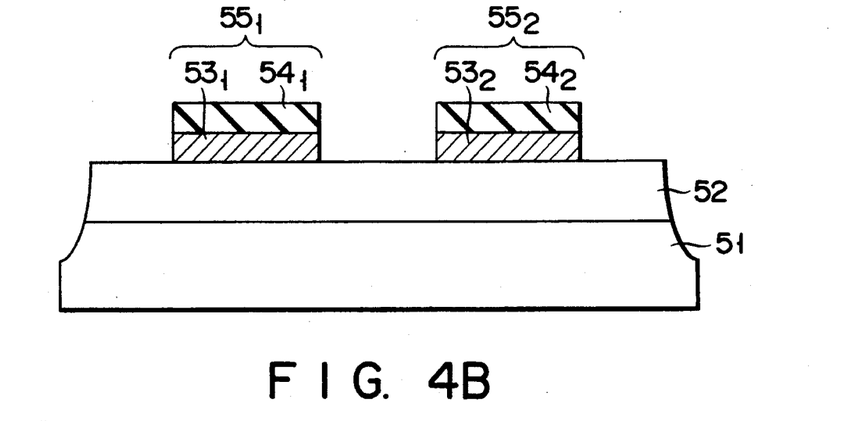

As shown in FIG. 4B, the plasma SiON film 54 and the ohmic metal layer 53 are anisotropically dry-etched using ion milling to form a source electrode portion $55_1$ consisting of a source electrode $53_1$ and a plasma SiON film $54_1$ which is formed thereon and a drain electrode portion $55_2$ consisting of a drain electrode $53_2$ and a plasma SiON film $54_2$ which is formed thereon. Thereafter, annealing (at a temperature of 430° C. for 5 minutes) is performed to improve ohmic characteristics. Undesired portions are removed to isolate elements from each other (mesa etching).

Figure 4C:
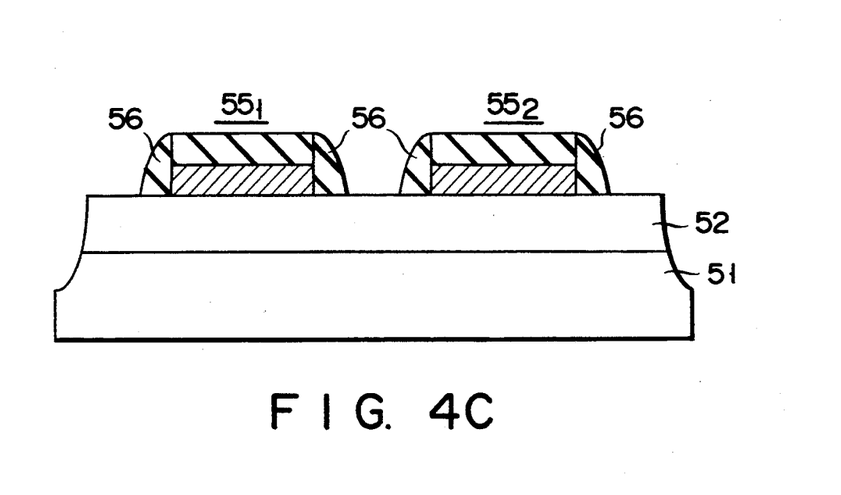

As shown in FIG. 4C, a plasma SiON film is formed to have a thickness of about 500 [nm], and the plasma SiON film is anisotropically etched by an RIE method to form side wall insulating films 56 on the side walls of the electrode portions $55_1$ and $55_2$.

Figure 4D:
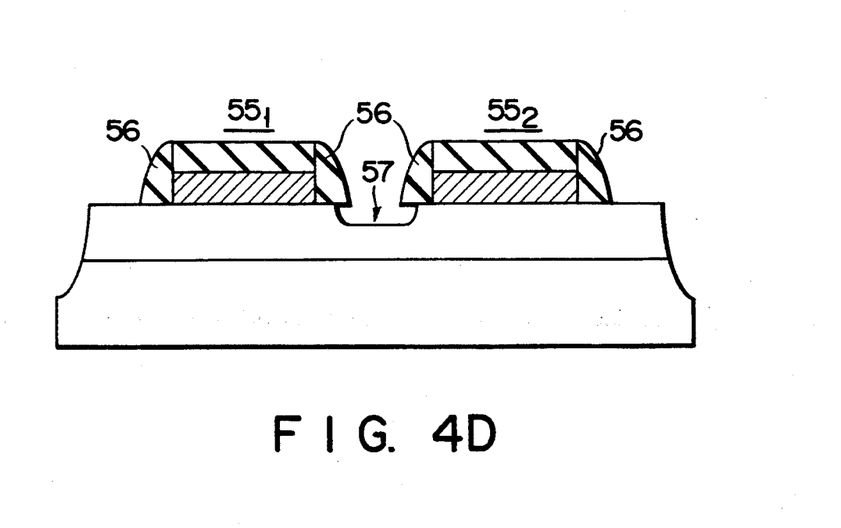

As shown in FIG. 4D, a groove 57 is formed in the active layer 52 between the electrode portions $55_1$ and $55_2$ using the side wall insulating films 56 as masks (recess etching).

Figure 4E:
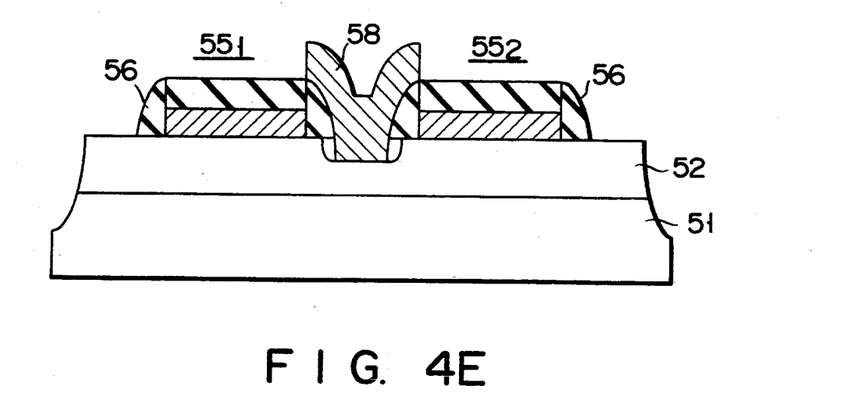

As shown in FIG. 4E, a photoresist (not shown) is coated on the resultant structure, and an opening is formed between the electrode portions $55_1$ and $55_2$ by a photoetching method. A gate metal layer which is a three-layered film consisting of, e.g., a Ti film having a thickness of 100 [nm], a Pt film having a thickness of 50 [nm], and an Au film having a thickness of 500 [nm] is formed. The gate metal layer is removed together with the photoresist (not shown) to obtain a gate electrode 58 (a lift-off technique).

Figure 4F:
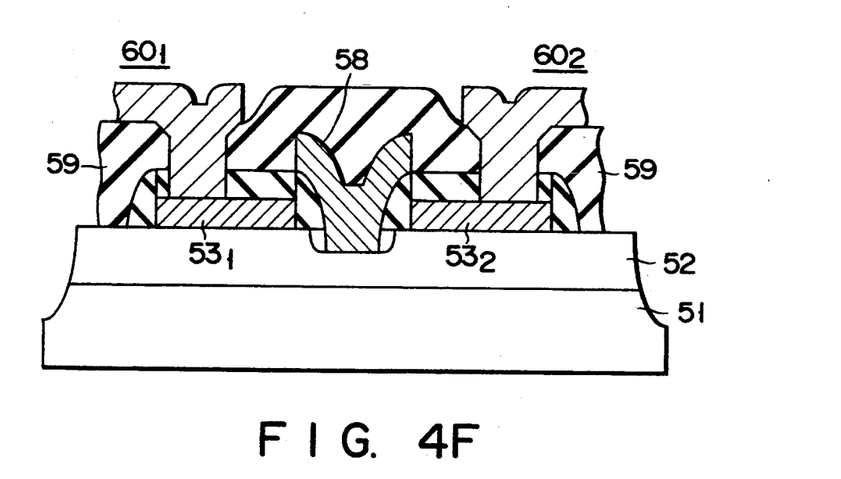

As shown in FIG. 4F, a plasma SiN film 59 is formed as an insulating interlayer, and a through hole reaching the source electrode $53_1$, the drain electrode $53_2$, and the like is formed in the plasma SiN film 59. A pad metal layer which is a three-layered film consisting of, e.g., a Ti film having a thickness of 100 [nm], a Pt film having a thickness of 50 [nm], and an Au film having a thickness of 800 [nm] is formed. The pad metal layer is patterned to form a source wiring $60_1$ and a drain wiring $60_2$.

According to the above method, a MESFET according to the second embodiment of the present invention is formed.

According to the MESFET obtained by the above manufacturing method, the following effect can be obtained.

In the first point, assuming that an interval between the source electrode $53_1$ and the drain electrode $53_2$ is set to be, e.g., 1.5 [μm] and that the width of the side wall insulating film 56 is set to be, e.g., 0.5 [μm], a fine element in which a distance between the source electrode $53_1$ and the gate electrode 58 is set to be 0.5 [μm], a distance between the drain electrode $53_2$ and the gate electrode 58 is set to be 0.5 [μm], and a gate length is set to be 0.5 [μm] can be uniformly formed at a high yield. This is because the side wall insulating films 56 are formed on both the side walls of the source electrode $53_1$ and the drain electrode $53_2$, and the gate electrode 58 is formed to be self-aligned to the source electrode $53_1$ and the drain electrode $53_2$ by using the side wall insulating films 56. As a result, variations in distances between the gate and source electrodes and between the gate and drain electrodes are eliminated, and variations in breakdown voltage of the element and variations in source resistance which influences high-frequency characteristics are relieved.

In the second point, even when an interval between the source electrode $53_1$ and the drain electrode $53_2$ is further decreased, since the plasma SiON films $54_1$ and $54_2$ serving as insulating films are respectively formed on the source electrode $53_1$ and the drain electrode $53_2$, the gate electrode 58 is not short-circuited with the source electrode $53_1$ and the drain electrode $53_2$. When the distances between the source and gate electrodes and between the gate and drain electrodes are decreased, although high-frequency characteristics in the element are improved, the source or drain electrode is easily short-circuited with the gate electrode, thereby decreasing a yield. According to the second embodiment, this disadvantage can be improved, and elements each having excellent high-frequency characteristics can be manufactured.

In the third point, since the groove 57 for forming a recess structure can be formed using the side wall insulating film 56 as a mask, the probability of formation of the groove 57 can be increased. This is because, e.g., a plasma SiON film (the side wall insulating film 56) having a higher adhesion strength with an underlying such as a substrate or an electrode than that of a photoresist or the like is used as a mask. Pattern crush caused by removing the underlying from the photoresist is hard to occur. Therefore, a probability of forming the groove 57 is increased, and an increase in yield can be realized.

Figure 5:
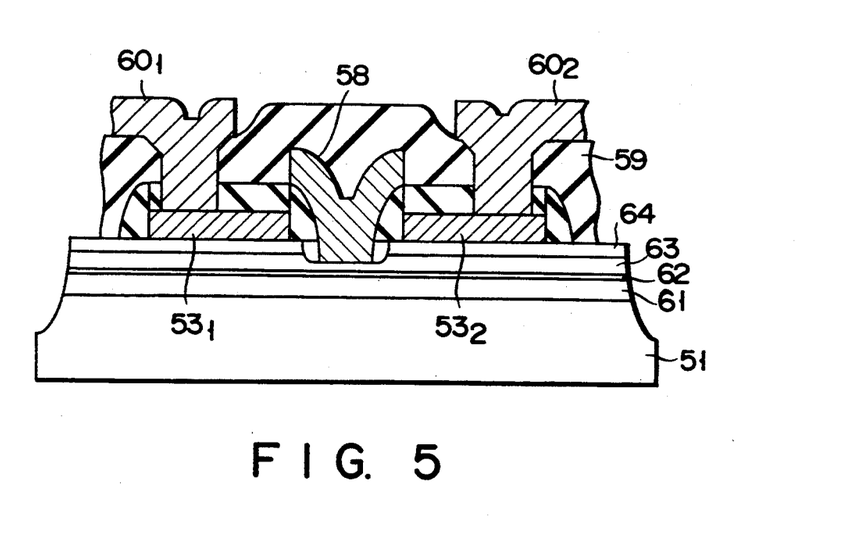
FIG. 5 is a sectional view showing an HEMT formed by the manufacturing method explained with reference to FIGS. 4A to 4F.

FIG. 5 is a sectional view showing an HEMT formed by the manufacturing method described in the second embodiment. The reference numerals in FIG. 5 denote the same parts as in FIG. 4, and only the different parts will be described below.

As shown in FIG. 5, in order to form the HEMT, an undoped GaAs layer 61 having a thickness of, e.g., 1 [μm], an undoped $Ga_{0.7}Al_{0.3}As$ layer 62 having a thickness of 5 [nm], and an n-type $Ga_{0.7}Al_{0.3}As$ layer 63 having a thickness of 30 [nm] are sequentially formed on a semi-insulating GaAs substrate 51 in place of the active layer. Thereafter, an n-type GaAs layer 64 is formed as a source/drain. The following steps are the same as the steps described with reference to FIGS. 4A to 4F.

As described above, according to the present invention, an HEMT and a MESFET are exemplified. However, the present invention is not limited to the HEMT and the MESFET and can be generally applied to compound semiconductor devices. In addition, the present invention can be applied to not only a mesa compound semiconductor device but a planer compound semiconductor device, as a matter of course.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
    forming an active layer in a semiconductor substrate;
    forming a source electrode and a drain electrode on said active layer;
    forming a groove in a portion of said active layer, said groove being between said source electrode and said drain electrode, wherein said groove forming step forms a first damage layer in said active layer;
    wet-etching exposed surfaces of said active layer, thereby removing said first damage layer in said active layer;
    forming an insulating layer on a side wall of said groove, a side wall of said source electrode and a side wall of said drain electrode, by anisotropic etching, wherein said insulating layer forming step forms a second damage layer in said active layer;
    wet-etching a portion of said active layer, exposing a bottom of said groove, thereby removing said second damage layer in said active layer; and
    forming a gate electrode on said portion of said active layer exposed in said bottom of said groove, after removing said first and second damage layers.

2. A method of manufacturing a semiconductor device according to claim 1, wherein said second damage layer is caused by said anisotropic etching.

3. A method of manufacturing a semiconductor device according to claim 2, wherein said anisotropic etching is a reactive ion etching.

4. A method of manufacturing a semiconductor device according to claim 1, wherein said semiconductor substrate comprises a compound semiconductor.

5. A method of manufacturing a semiconductor device according to claim 4, wherein said compound semiconductor comprises GaAs.

* * * * *